(12) United States Patent
Ushiku

(10) Patent No.: US 11,569,119 B2
(45) Date of Patent: Jan. 31, 2023

(54) CONVEYANCE APPARATUS, SUBSTRATE PROCESSING APPARATUS, AND METHOD OF MANUFACTURING ARTICLE

(71) Applicant: CANON KABUSHIKI KAISHA, Tokyo (JP)

(72) Inventor: Kentarou Ushiku, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/338,836

(22) Filed: Jun. 4, 2021

(65) Prior Publication Data
US 2021/0407844 A1 Dec. 30, 2021

(30) Foreign Application Priority Data
Jun. 29, 2020 (JP) .............................. JP2020-111911

(51) Int. Cl.
*H01L 21/687* (2006.01)
*G03F 7/20* (2006.01)
(Continued)

(52) U.S. Cl.
CPC ........ *H01L 21/68707* (2013.01); *G03F 7/707* (2013.01); *G03F 7/70775* (2013.01);
(Continued)

(58) Field of Classification Search
CPC ........... H01L 21/68707; H01L 21/6838; H01L 23/544; H01L 2223/54426;
(Continued)

(56) References Cited

U.S. PATENT DOCUMENTS

| 7,654,596 B2 * | 2/2010 | Mantz ............... H01L 21/68707 414/941 |
| 9,356,539 B2 | 5/2016 | Van Lievenoogen |

(Continued)

FOREIGN PATENT DOCUMENTS

| JP | 2000021956 A | 1/2000 |
| JP | 5721453 B2 | 5/2015 |

(Continued)

OTHER PUBLICATIONS

Extended European search report issued in European Appln. No. 21175861.0 dated Nov. 11, 2021.

*Primary Examiner* — Hung V Nguyen
(74) *Attorney, Agent, or Firm* — Rossi, Kimms & McDowell LLP

(57) ABSTRACT

A conveyance apparatus for conveying a substrate chuck includes a hand for supporting the substrate chuck, a main body for pivotally supporting the hand about a vertical axis and movable in horizontal and vertical directions, and a guiding portion for guiding pivotal motion of the hand. The hand includes hand distal end portions and a hand proximal end portion supported by the main body. An end surface of the hand proximal end portion facing the main body is formed in an arc shape of a circle centered about a vertical axis of a reference position between the hand distal end portions. The guiding portion includes a guiding surface that has a shape corresponding to the end surface of the hand proximal end portion and can slidably contact the end surface.

23 Claims, 5 Drawing Sheets

(51) Int. Cl.
*H01L 21/683* (2006.01)
*H01L 23/544* (2006.01)

(52) U.S. Cl.
CPC ........ *H01L 21/6838* (2013.01); *H01L 23/544* (2013.01); *H01L 2223/54426* (2013.01)

(58) Field of Classification Search
CPC ......... H01L 21/67259; H01L 21/67748; H01L 21/67742; H01L 21/67265; H01L 21/68721; G03F 7/707; G03F 7/70775; G03F 9/7011; G03F 7/70733
See application file for complete search history.

(56) References Cited

U.S. PATENT DOCUMENTS

| | | | |
|---|---|---|---|
| 10,007,197 | B2 | 6/2018 | Lof |
| 10,109,515 | B2 * | 10/2018 | Kanazawa ........ H01L 21/67742 |
| 11,335,578 | B2 * | 5/2022 | Yoshida ............ H01L 21/67259 |
| 2017/0069517 | A1 | 3/2017 | Goto |

FOREIGN PATENT DOCUMENTS

| | | |
|---|---|---|
| WO | 2004077531 A1 | 9/2004 |
| WO | 2014054034 A2 | 4/2014 |
| WO | 2015135782 A1 | 9/2015 |

\* cited by examiner

CONVEYANCE APPARATUS, SUBSTRATE PROCESSING APPARATUS, AND METHOD OF MANUFACTURING ARTICLE

BACKGROUND OF THE INVENTION

Field of the Invention

The present invention relates to a conveyance apparatus, a substrate processing apparatus, and a method of manufacturing an article.

Description of the Related Art

For example, in a substrate processing apparatus such as an exposure apparatus or the like that forms a pattern on a substrate, a conveyance apparatus that conveys a substrate or an original is used. The conveyance apparatus is required to perform accurate positional control of a substrate or an original as a target object.

Japanese Patent Laid-Open No. 2000-21956 discloses a rotating stage that supports a substrate and rotates the substrate. Japanese Patent No. 5721453 discloses that a substrate (plate-like member) is made to float without contact by discharging gas to the substrate, and a guide which includes a tilted portion is used to relatively displace the substrate and a support portion.

A substrate chuck conveyance apparatus will be considered here. In a case in which an alignment mechanism as disclosed in Japanese Patent Laid-Open No. 2000-21956 is to be applied in the correction of a rotational shift of the substrate chuck, a plurality of dedicated alignment stages will be needed. In a case in which the positioning of the rotational direction of the substrate chuck is to be performed not by dedicated alignment stages, but by a substrate stage for exposing a substrate, the substrate stage will need to be drivable at large strokes in the rotational direction, and the substrate stage will need to be upsized.

In addition, if rotation adjustment is to be performed on a substrate chuck which is heavier than a substrate by discharging gas in the manner of Japanese Patent No. 5721453, a large amount of gas will need to be supplied, thereby leading an increase in the size and the complexity of the apparatus.

SUMMARY OF THE INVENTION

The present invention provides, for example, a conveyance apparatus that can advantageously perform positional correction of the rotational direction of a substrate chuck in a simple manner.

The present invention in its one aspect provides a conveyance apparatus for conveying a substrate chuck, comprising a hand configured to support the substrate chuck, a main body configured to pivotally support the hand about a vertical axis and move in a horizontal direction and a vertical direction, and a guiding portion provided in the main body and configured to guide pivotal motion of the hand, wherein the hand includes a plurality of hand distal end portions each including a placement surface on which the substrate chuck is to be placed, and a hand proximal end portion supported by the main body and configured to support a base portion of each of the plurality of hand distal end portions, and wherein an end surface of the hand proximal end portion facing the main body is formed in an arc shape of a circle centered about a vertical axis of a reference position between the plurality of the hand distal end portions, and wherein the guiding portion includes a guiding surface that has a shape corresponding to the end surface of the hand proximal end portion and can slidably contact the end surface.

Further features of the present invention will become apparent from the following description of exemplary embodiments (with reference to the attached drawings).

DESCRIPTION OF THE EMBODIMENTS

Figure 1:
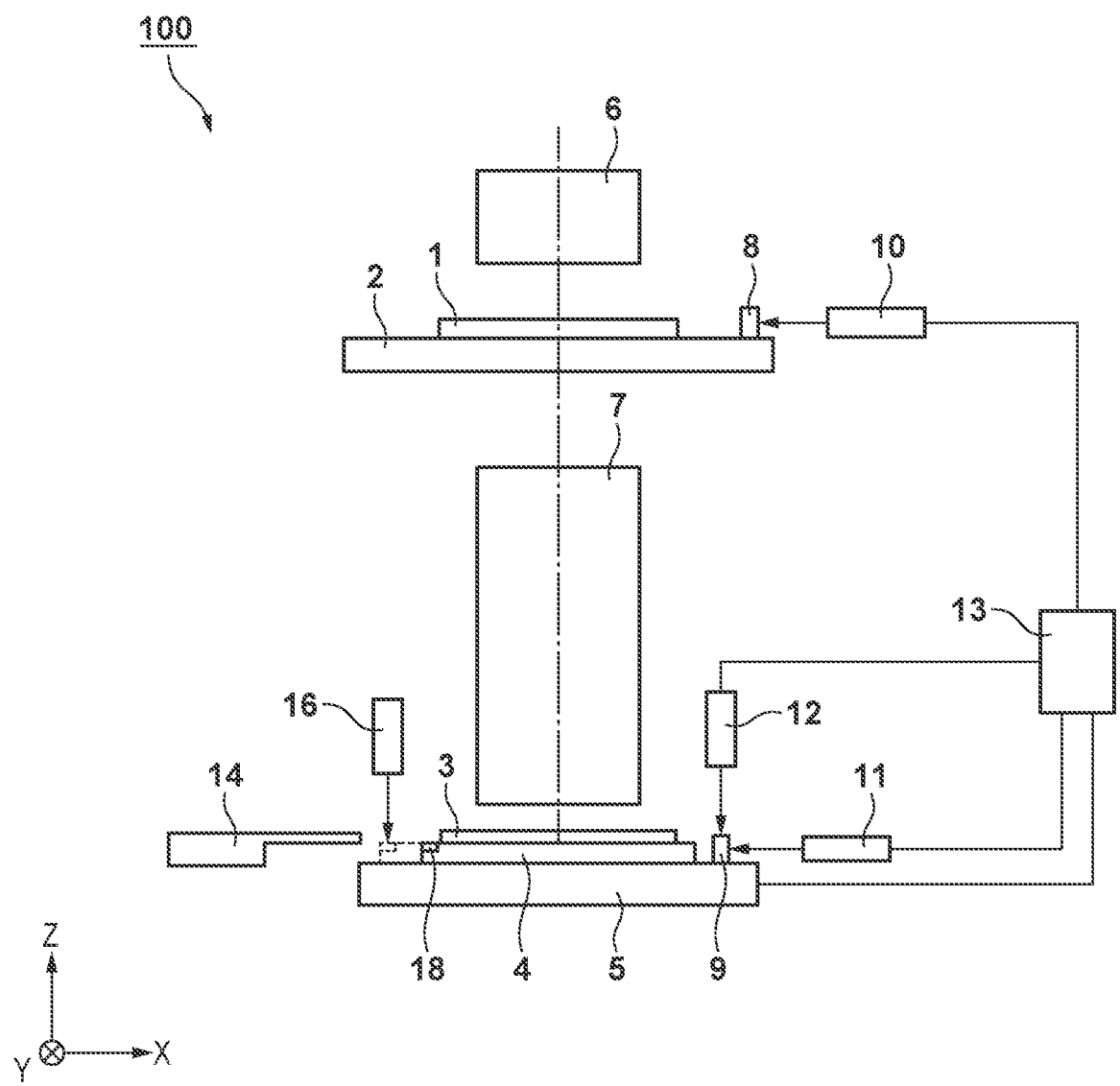
FIG. 1 is a view showing the arrangement of an exposure apparatus.

An embodiment of the present invention will be described in detail below with reference to the accompanying drawings. Note that the following embodiment does not limit the invention according to the scope of the appended claims. Although a plurality of features are described in the embodiment, not all the features are essential to the invention and the plurality of features may arbitrarily be combined. The same reference numerals denote the same or similar parts and a repetitive description thereof will be omitted.

This embodiment will describe an example in which a conveyance apparatus for conveying an object is used in a substrate processing apparatus for processing a substrate. An object to be conveyed by the conveyance apparatus can be, for example, a substrate chuck for chucking a substrate. The substrate processing apparatus can be any one of, for example, a lithography apparatus (an imprint apparatus, an exposure apparatus, a charged particle beam drawing apparatus, or the like), a deposition apparatus (a CVD apparatus or the like), a processing apparatus (a laser processing apparatus or the like), and an inspection apparatus (an overlay inspection apparatus or the like). An imprint apparatus forms a pattern on a substrate by curing an imprint material while bringing a mold (original) into contact with the imprint material supplied on the substrate. An exposure apparatus exposes, via an original (reticle) serving as an original mask, a photoresist supplied on a substrate to form a latent image corresponding to the pattern of an original on the photoresist. A charged particle beam drawing apparatus uses a charged particle beam to draw a pattern on a photoresist supplied on a substrate and form a latent image on the photoresist. A substrate to be processed by such substrate processing apparatuses can be, for example, a silicon wafer, but may also be a glass substrate, a copper substrate, a resin substrate, an SiC substrate, a sapphire substrate, or the like. An example in which the substrate processing apparatus is formed as an exposure apparatus will be described to provide a more specific example hereinafter.

FIG. 1 is a schematic view showing the arrangement of an exposure apparatus 100 according to the embodiment. In this specification, directions are indicated in an XYZ-coordinate system in which an X-Y plane is set as a horizontal plane. In general, a substrate 3 is placed on a substrate stage 5 so that its surface will be parallel to the horizontal plane (X-Y plane). Hence, in the following description, directions perpendicular to each other in a plane along the surface of the substrate 3 are set as the X-axis and the Y-axis, and a direction perpendicular to the X-axis and the Y-axis is set as the Z-axis. Also, in the following description, directions parallel to the X-axis, the Y-axis, and the Z-axis will be set as the X direction, the Y direction, and the Z direction, respectively, in the XYZ-coordinate system. The rotational direction about the X-axis, the rotational direction about the Y-axis, and the rotational direction about the Z-axis will be referred to as the θx direction, the θy direction, and the θz direction, respectively.

The exposure apparatus 100 includes a mask stage 2 that holds a mask (original) 1, an illumination optical system 6 that illuminates the mask 1 held by the mask stage 2, and a projection optical system 7 that projects an image of the pattern of the mask 1 to the substrate 3. The exposure apparatus 100 further includes a substrate chuck 4 that chucks and holds the substrate 3 and a substrate stage 5 that can move while holding the substrate chuck 4. The exposure apparatus 100 also includes a controller 13 that controls the overall operation of the exposure apparatus 100. The controller 13 can be implemented by a computer including a CPU and a memory. Note that the controller 13 may be arranged in a chamber (not shown) that contains the various components of the above-described exposure apparatus or arranged outside of the chamber.

In this embodiment, the exposure apparatus 100 can be a scanning exposure apparatus (scanner) that can transfer the pattern of the mask 1 to the substrate 3 while scanning the mask 1 and the substrate 3 in synchronization with each other in a scanning direction (for example, the Y direction). Alternatively, the exposure apparatus 100 can be an exposure apparatus (stepper) that can project the pattern of the mask 1 to the substrate 3 by fixing the mask 1.

The illumination optical system 6 illuminates the mask 1 with light (exposure light) of a uniform illumination distribution. As the exposure light, for example, the g-ray (a wavelength of approximately 436 nm) or the i-ray (a wavelength of approximately 365 nm) of a mercury lamp, a KrF excimer laser (a wavelength of approximately 248 nm), an ArF excimer laser (a wavelength of approximately 143 nm), extreme ultraviolet light (EUV light), or the like can be used.

The mask stage 2 is formed to be able to two-dimensionally move in a plane, that is, the X-Y plane perpendicular to the optical axis of the projection optical system 7 and to be rotatable in the θz direction. The mask stage 2 can be driven by a driving device (not shown) such as a linear motor or the like.

A reflecting mirror 8 is arranged on the mask stage 2. A laser interferometer 10 is arranged at a position facing the reflecting mirror 8. The laser interferometer 10 measures, in real time, the rotation angle and the position of the mask stage 2 in the two-dimensional direction (X-Y direction), and transmits the measurement result to the controller 13. The controller 13 controls the driving device of the mask stage 2 based on the measurement result from the laser interferometer 10, and positions the mask 1 held by the mask stage 2.

The projection optical system 7 includes a plurality of optical elements, and projects the pattern of the mask 1 onto the substrate 3 at a predetermined projection magnification. The substrate 3 is coated with a photosensitive agent (resist), and a latent image pattern will be formed on the photosensitive agent when the image of the pattern of the mask 1 is projected onto the photosensitive agent.

The substrate stage 5 can include a Z stage that can hold the substrate 3 via the substrate chuck 4 and move in the Z direction, an X-Y stage that can hold the Z stage and move in the X and Y directions, and a base that supports the X-Y stage. Each of the above-described stages forming the substrate stage 5 is driven by a driving device such as a linear motor or the like. The substrate chuck 4 is arranged to be detachable from the substrate stage 5.

A reflecting mirror 9 is arranged in the substrate stage 5. Laser interferometers 11 and 12 are arranged at positions facing the reflecting mirror 9. The laser interferometer 11 measures, in real time, the positions in the X direction, the Y direction, and the θz direction of the substrate stage 5, and transmits the measurement results to the controller 13. In a similar manner, the laser interferometer 12 measures, in real time, the positions in the Z direction, the ex direction, and the θy direction of the substrate stage 5, and transmits the measurement results to the controller 13. The controller 13 controls the driving device of the substrate stage 5 based on the measurement results of the laser interferometer 11 and the laser interferometer 12, and positions the substrate 3 held by the substrate stage 5.

A conveyance apparatus 14 conveys the substrate chuck 4 onto the substrate stage 5. A detector 16 is arranged on the upper side the substrate stage 5 and the substrate chuck 4. The detector 16 measures each mark 18 (FIG. 2) formed on the substrate chuck 4 to detect the position of the substrate chuck 4 in the rotation direction (θz direction). The detector 16 can include an illumination system for illuminating the marks 18, an imaging optical system for forming an image of each mark 18 from the light from the mark 18, a sensor for capturing the image formed by the imaging optical system, and the like. The detector 16 can be attached to a hand proximal end portion or the like of a chamber (not shown) of the exposure apparatus 100. Alternatively, the detector 16 may be attached to the conveyance apparatus 14.

The arrangement of the conveyance apparatus 14 will be described in detail with reference to FIG. 2. The conveyance apparatus 14 can include a hand 15 for supporting the substrate chuck 4, a main body 159 for supporting the hand 15, and a linear motion mechanism 17 for moving the main body 159 (that is, the hand 15) in the X direction (horizontal direction) and the Z direction (vertical direction). The hand 15 includes two hand distal end portions 151 each including a placement surface where the substrate chuck 4 is to be placed. The two hand distal end portions 151 are arranged so that the substrate chuck 4 can be placed horizontally. The base portions of the two hand distal end portions 151 are supported by a hand proximal end portion 152. Also, this hand proximal end portion 152 is supported by the main body 159. The main body 159 pivotally supports the hand 15 about a vertical axis (about the Z-axis, that is, in the θz direction). The hand proximal end portion 152 and the main body 159 are connected to each other by a bolt or the like in a manner that will not inhibit the pivotal motion of the hand 15. Note that the number of the hand distal end portions included by the hand 15 need not be limited to the two hand distal end portions 151, and three or more hand distal end portions may be included. That is, the hand 15 suffices to include a plurality of the distal end portions 151.

Figure 2:
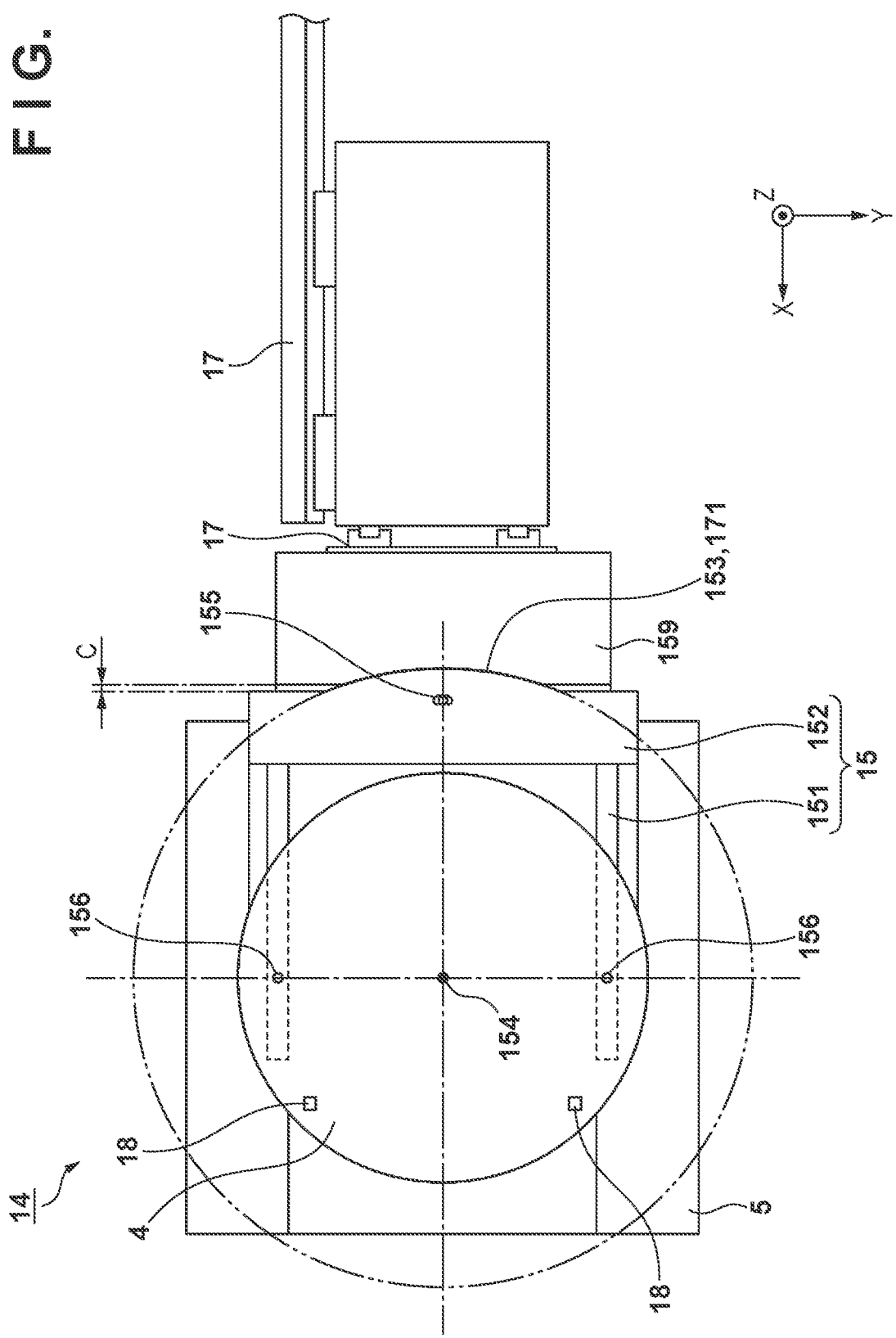
FIG. 2 is a view showing the arrangement of a conveyance apparatus.
Figure 3:
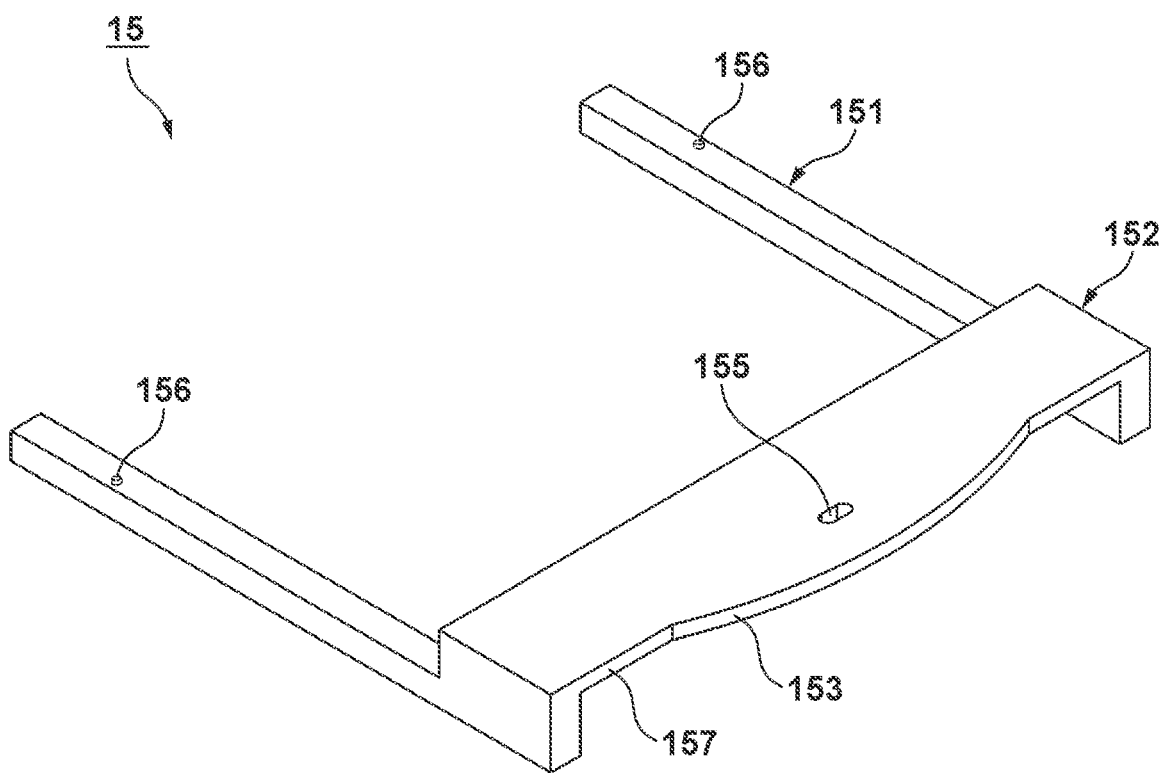
FIG. 3 is a view showing the arrangement of a hand.
Figure 4:
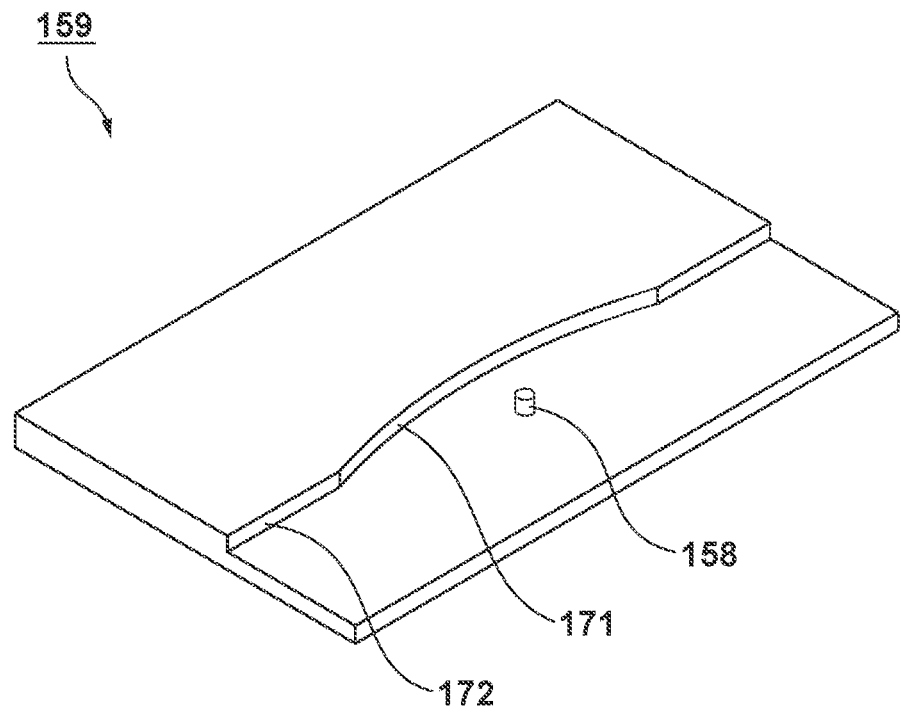
FIG. 4 is a view showing the arrangement of a main body.

FIGS. 3 and 4 show the main components obtained by disassembling the hand 15 and the main body 159. FIG. 3 shows the main components of the hand 15, and FIG. 4 shows the main components of the main body 159. An end surface 153, of the hand proximal end portion 152, which faces the main body 159 is formed in an arc shape of a circle centered about the vertical axis of a reference position 154 (FIG. 2) between the two hand distal end portions 151. Here, the reference position 154 corresponds to the center of the substrate chuck 4 to be placed on the hand. Straight portions 157 can be formed on both ends of the arcuate end surface 153. A guiding portion 171 for guiding the pivotal motion of the hand 15 is provided on the opposing main body 159. In the example shown in FIG. 4, the guiding portion 171 has a guiding surface that has a shape corresponding to the end surface 153 of the hand proximal end portion 152 and can slidably contact the end surface 153. Straight portions 172 can be formed on both ends of the guiding surface. As a result, the conveyance apparatus 14 can pivot the substrate chuck 4 about the vertical axis of the reference position 154. When the hand proximal end portion 152 and the straight portions 157 are in an assembled state, a clearance C, as shown in FIG. 2, is ensured between the straight portions 157 of the hand proximal end portion 152 and the straight portions 172 of the main body 159. The hand 15 is pivoted in a range that corresponds to this clearance C.

Note that although the guiding portion 171 forms only a partial arc of a circle about the vertical axis of the reference position 154 in the examples shown in FIGS. 2 to 4, the guiding portion 171 may be formed as a guide along the entire circumference or almost the entire circumference of the circle.

The conveyance apparatus 14 can include a restricting portion that restricts the hand 15 from positionally shifting in the horizontal direction with respect to the main body 159 when the hand 15 is to be pivoted about the vertical axis of the reference position 154. For example, the restricting portion can include a protrusion 158 which is formed on the main body 159 and an engaging portion 155 which is formed on the hand proximal end portion 152 of the hand 15 and engages with the protrusion 158. The protrusion 158 can be formed by a pin, a boss, or the like. The engaging portion 155 can be a hole or a groove. For example, the engaging portion 155 can be an arc length hole corresponding to the shape of the guiding portion 171. More specifically, the shape of the hole or the groove can be another shape in accordance with the amount of positional shift that can be allowed. On the other hand, the engaging portion 155 may be formed on the main body 159 and the protrusion 158 may be formed on the hand proximal end portion 152 of the hand 15. That is, it is sufficient as long as the protrusion 158 is formed on one of the hand 15 and the main body 159 and the engaging portion 155 is formed on the other of the hand 15 and the main body 159. By arranging such a restriction portion, the hand 15 can be suppressed from positionally shifting in the horizontal direction more than necessary while the hand 15 is being pivoted.

In addition, in this embodiment, an engaging protrusion 156 that engages with an engagement hole, which is formed in the back surface of the substrate chuck 4, is provided on the placement surface of each of the two hand distal end portions 151. Each engaging protrusion 156 can be formed by a pin, a boss, or the like. As a result, the two hand distal end portions 151 and the substrate chuck 4 can be positioned accurately. The substrate chuck 4 can be adjusted integrally with the hand 15 when the hand 15 is rotated and adjusted. In FIG. 2, the reference position 154 can be set at the midpoint of a straight line connecting the respective engaging protrusions 156 of the two hand distal end portions. As described above, the reference position 154 corresponds to the center of the substrate chuck 4.

The hand 15 can be moved linearly in the X direction and the Z direction by the linear motion mechanism 17. When the substrate chuck 4 placed on the hand 15 is moved in the X direction by the linear motion mechanism 17 and reaches a mounting position above the substrate stage 5, the hand 15 or the linear motion mechanism 17 is abutted against a stopper (not shown) arranged on the linear motion mechanism 17. As a result, the positioning with respect to the X direction can be performed accurately when the substrate chuck 4 is to be mounted. Furthermore, the hand 15 can mount the substrate chuck 4 onto the substrate stage 5 when the substrate chuck 4 is lowered in the Z direction by the linear motion mechanism 17. The substrate chuck 4 can be removed by inserting the hand 15 between the substrate stage 5 and the substrate chuck 4 by the X-directional movement of the linear motion mechanism 17 and raising the hand 15 by the Z-directional movement of the linear motion mechanism 17.

To allow the displacement amount driven in a rotation adjustment operation to be grasped in a case in which the rotation adjustment operation of the substrate chuck 4 is to be performed outside the detection range of the detector 16, a scale representing the pivotal amount of the hand 15 can be arranged on, for example, the hand proximal end portion 152 of the hand 15. A set screw with a micrometer, an encoder, or the like may also be arranged instead of the scale.

Figure 5:
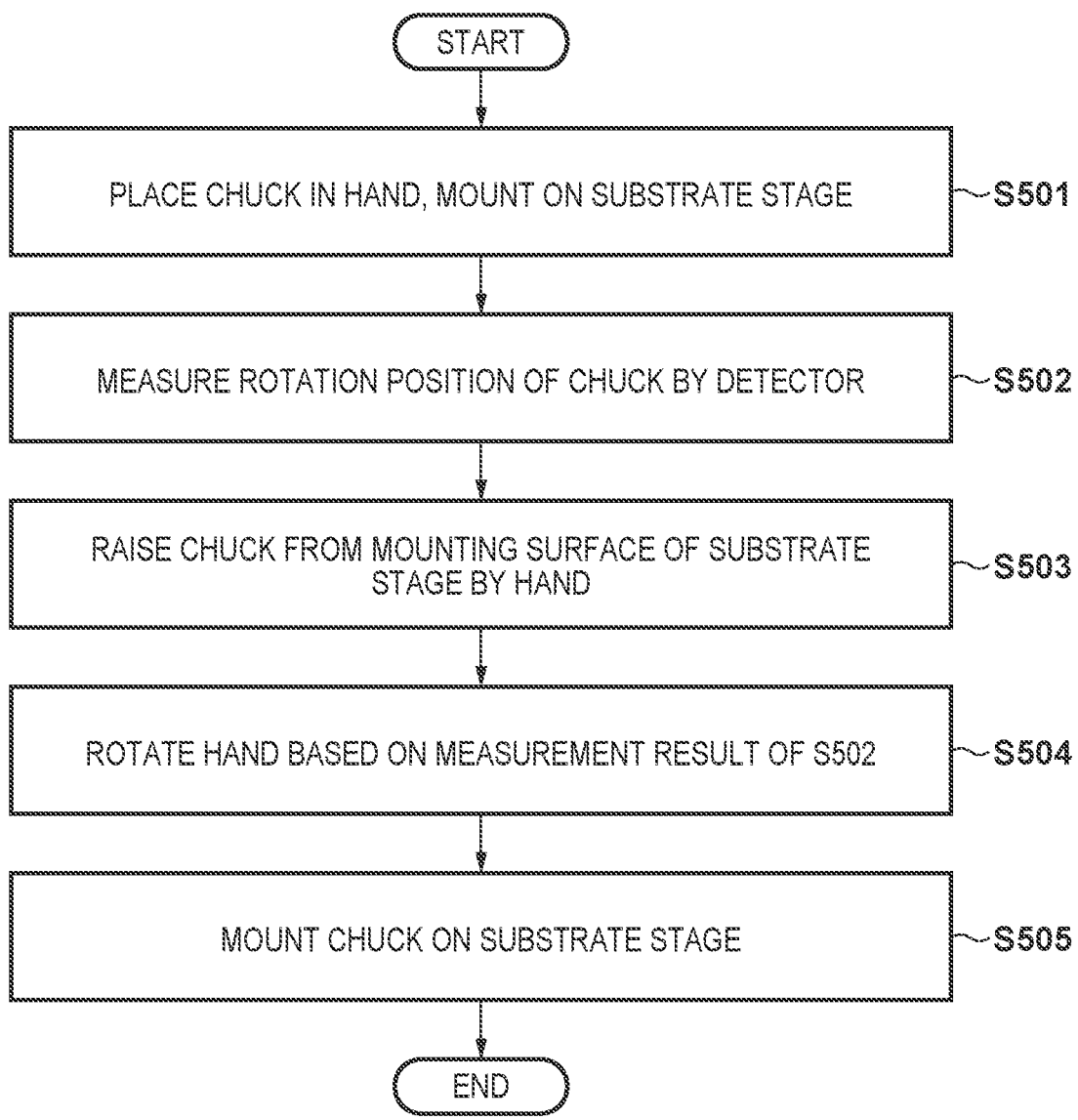
FIG. 5 is a flowchart of a method of adjusting a rotational shift of a substrate chuck.

A method of adjusting the rotation position of the substrate chuck 4 according to the embodiment will be described with reference to FIG. 5.

In step S501, the controller 13 controls the conveyance apparatus 14 so that the substrate chuck 4 will be placed on the hand 15 and the substrate chuck 4 will be subsequently mounted onto the substrate stage 5. In step S502, the controller 13 measures, based on the detection result obtained by the detector 16, the position (rotational shift) of the substrate chuck 4 in the rotation direction (Oz direction). As shown in FIG. 2, the plurality of marks 18 are formed on the substrate chuck 4. The controller 13 can obtain the position of the substrate chuck 4 in the rotation direction by using the detector 16 to detect the position of each mark 18 and calculating a difference between the detected position and the position of the mark 18 without the rotational shift. Here, in a case in which the mark 18 is not in a position that can be detected by the detector 16, the controller 13 will adjust the position of the substrate stage 5 in the X direction and the Y direction to allow the detector 16 to detect the mark 18.

Figure 7:
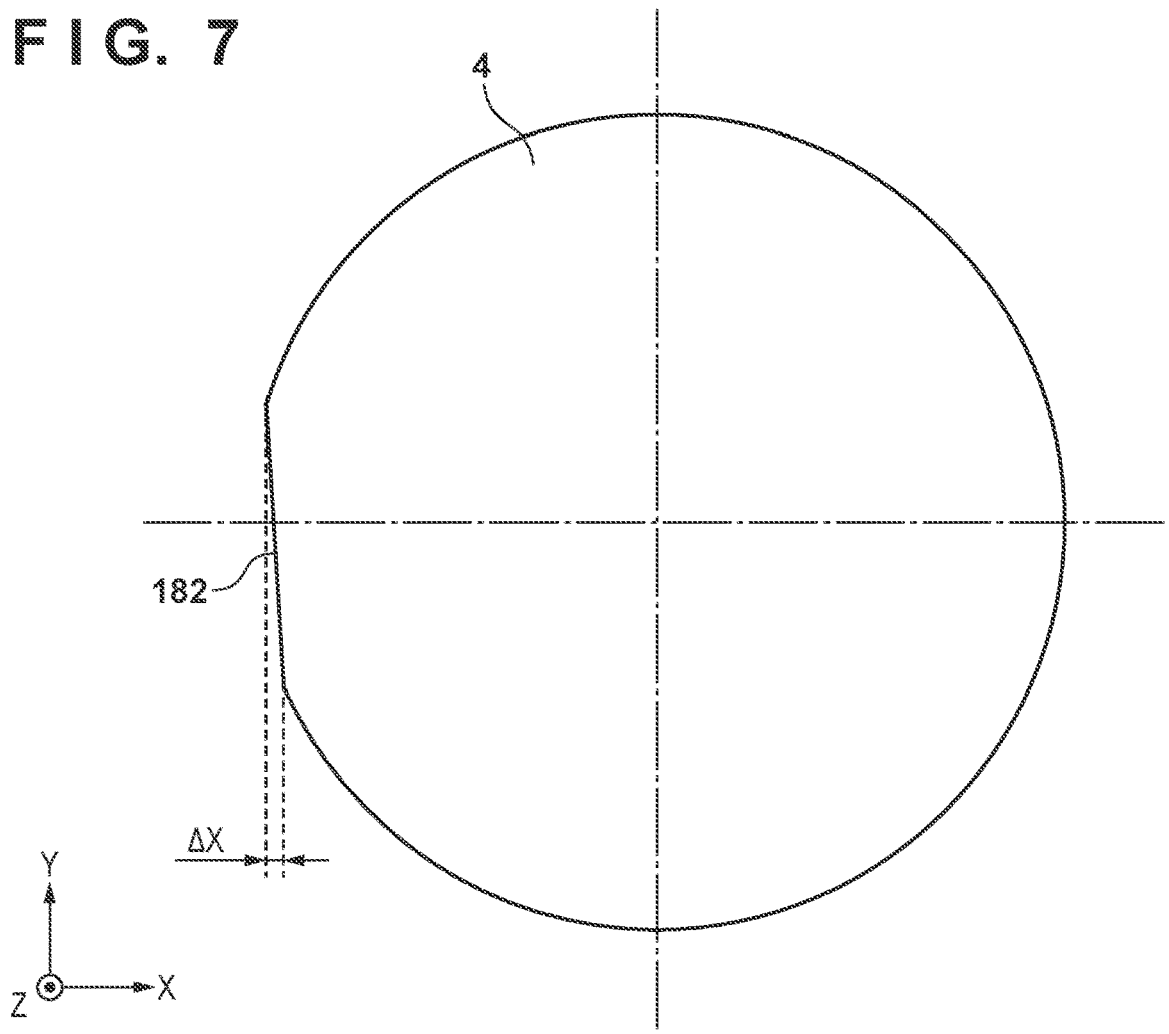
FIG. 7 is a view showing an example in which a straight portion formed on a part of the periphery of the substrate chuck is used as a mark.

Note that although FIG. 2 shows an example in which the plurality of marks 18 are formed on the substrate chuck 4, a portion of the periphery of the substrate chuck 4 can be formed as a straight portion 182 (orientation flat) and this portion can be used as the mark as shown in FIG. 7. In such a case, the detector 16 will detect this straight portion 182. Letting a state in which the straight portion 182 is parallel to the Y direction be a state without a rotational shift, the rotational shift amount of the substrate chuck 4 can be calculated based a known length of the straight portion 182 and a shift amount AA of the straight portion 182 in the X direction.

Alternatively, an arrangement in which a back-side observation optical system (not shown) for observing the back surface side (suction surface side) of the substrate is arranged inside the substrate chuck 4 can be considered. In this case, the detector 16 will detect, via the back-side observation optical system in the substrate chuck 4, each alignment mark on the suction surface of a substrate placed on the substrate chuck 4. Since the rotational shift of the substrate chuck 4 will cause a relative positional shift between the back-side observation optical system and each alignment mark on the suction surface of the substrate, the field of view will become narrower during alignment mark detection. The rotational shift of the chuck may be calculated based on this shift amount of the field of view.

In step S503, the controller 13 controls the conveyance apparatus 14 to raise the substrate chuck 4 from the mounting surface of the substrate stage 5 by using the hand 15. This is performed to prevent friction between the substrate chuck 4 and the substrate stage 5 when the substrate chuck 4 is to be rotated in the following step S504.

In step S504, positional adjustment of the substrate chuck 4 in the rotation direction about the center axis is performed. More specifically, in step S504, the controller 13 rotates the hand 15 in the θz direction based on the measurement result of step S502. At this time, the substrate chuck 4 may be temporarily removed from the hand 15, and the substrate chuck 4 may be placed on the hand 15 again after the positional adjustment of the hand 15 has been completed. Also, the rotation driving operation may be performed manually by a human hand instead of being performed under automatic control by the controller 13.

After the adjustment of the rotation position of the substrate chuck 4 has been completed, the controller 13 will control, in step S505, the conveyance apparatus 14 to place the substrate chuck 4 onto the substrate stage 5. If this operation is to be performed manually, a process for confirming whether the rotational shift of the substrate chuck 4 is within an allowable range may be performed by using the detector 16 after the substrate chuck 4 has been mounted onto the substrate stage 5.

The hand 15 is arranged to be detachable from the main body 159. For example, when a rotation-adjusted chuck a is to be replaced with a chuck different from the chuck a, a set formed by the chuck a and a rotation-adjusted rotating hand A may be replaced with a set formed by the chuck and a rotating hand B. This will allow the processes of steps S502 to S505 to be omitted when the chuck a is to be mounted onto the substrate stage 5 again.

(Modification)

A modification of the guiding portion 171 will be described with reference to FIG. 6.

Figure 6:
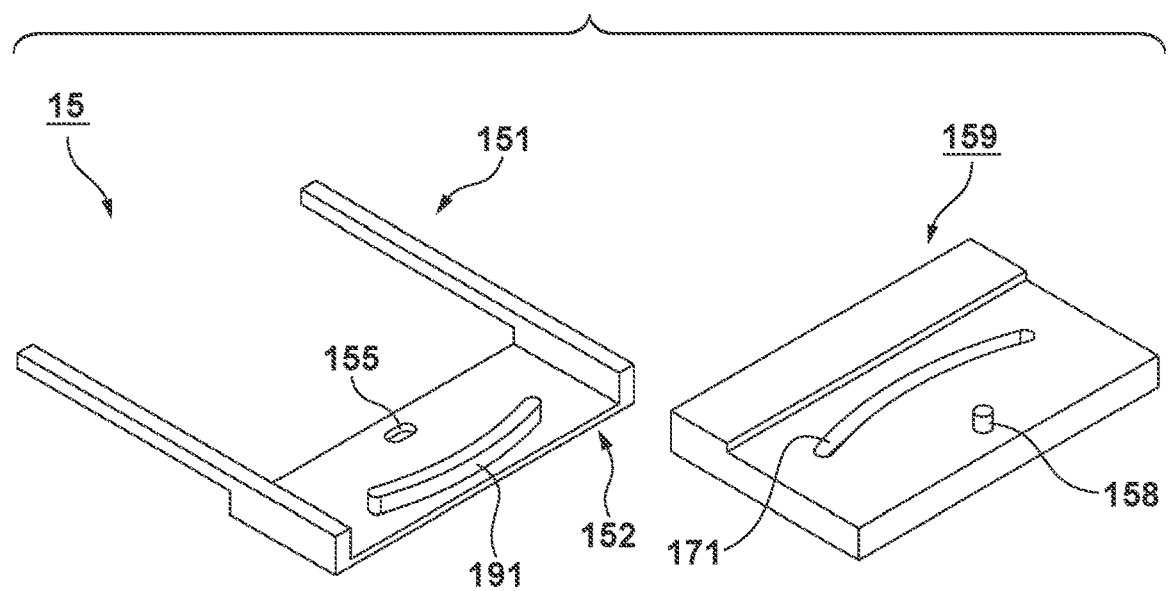
FIG. 6 is a view showing a modification of the hand and a main body.

In FIG. 6, a convex portion 191, which is formed in an arc shape of a circle centered about the vertical axis of the reference position 154 (see FIG. 2) between the two hand distal end portions 151, is formed on the back surface of the hand proximal end portion 152 of the hand 15. With respect to this convex portion, a concave portion that is shaped in the above-described arc shape of the circle and engages with the convex portion 191 is formed as the guiding portion 171 on the front surface of the main body 159. This kind of arrangement will allow the hand 15 to be pivoted accurately.

Other arrangements of this modification are similar to those of the above-described embodiment. This modification may also include a restricting portion that restricts the hand 15 from positionally shifting in the horizontal direction with respect to the main body 159 during the pivotal motion of the hand 15. Hence, the engaging portion 155 and the protrusion 158 similar to those shown in FIGS. 3 and 4, respectively, are shown in the example of FIG. 6 as well.

In addition, the engaging protrusions 156 as shown in FIG. 3 can be provided on the respective placement surfaces of the two hand distal end portions 151. However, the engaging protrusions 156 are not shown in FIG. 6 since the placement surfaces of the two hand distal end portions 151 are located at the respective lower surfaces of the two hand distal end portions.

<Embodiment of Method of Manufacturing Article>

A method of manufacturing an article according to the embodiment of the present invention is suitable for manufacturing an article such as a microdevice such as a semiconductor device or an element having a microstructure. The method of manufacturing an article according to the embodiment can include a step of forming a pattern of an original on a substrate by using the above-described substrate processing apparatus, and a step of processing the substrate on which the pattern has been formed in the preceding step. Furthermore, this article manufacturing method can include other well-known steps (oxidization, deposition, vapor deposition, doping, planarization, etching, resist removal, dicing, bonding, packaging, and the like). The method of manufacturing an article according to the embodiment is superior to a conventional method in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-111911, filed Jun. 29, 2020, which is hereby incorporated by reference herein in its entirety.

What is claimed is:

1. A conveyance apparatus for conveying a substrate chuck, comprising:
   a hand configured to support the substrate chuck;
   a main body configured to pivotally support the hand about a vertical axis and move in a horizontal direction and a vertical direction; and
   a guiding portion provided in the main body and configured to guide pivotal motion of the hand, wherein the guiding portion includes a guiding surface parallel to the vertical direction,
   wherein the hand includes a plurality of hand distal end portions each including a placement surface on which the substrate chuck is to be placed, and a hand proximal end portion supported by the main body and configured to support a base portion of each of the plurality of hand distal end portions,
   wherein the hand proximal end portion includes an end surface facing the guiding surface, wherein the end surface is formed in an arc shape of a circle centered about a vertical axis of a reference position between the plurality of the hand distal end portions,
   wherein the vertical axis corresponds to a center axis of the substrate chuck supported by the hand and the arc shape permits the substrate chuck, supported by the hand, to be rotatable around the vertical axis, and
   wherein the guiding surface has a shape corresponding to the end surface of the hand proximal end portion, and is configured to slidably contact the end surface.

2. A conveyance apparatus for conveying a substrate chuck, comprising:
   a hand configured to support the substrate chuck;
   a main body configured to pivotally support the hand about a vertical axis and move in a horizontal direction and a vertical direction; and
   a guiding portion provided in the main body and configured to guide pivotal motion of the hand, wherein the hand includes a plurality of hand distal end portions each including a placement surface on which the substrate chuck is to be placed, and a hand proximal end portion supported by the main body and configured to support a base portion of each of the plurality of hand distal end portions, wherein a convex portion formed in an arc shape of a circle about the vertical axis of a reference position between the plurality of hand distal end portions is formed on a back surface of the hand proximal end portion, wherein the vertical axis corresponds to a center axis of the substrate chuck supported by the hand and the arc shape permits the substrate chuck, supported by the hand, to be rotatable around the vertical axis, and wherein the guiding portion includes, in a front surface of the main body, a concave portion shaped in the arc shape of the circle and configured to engage with the convex portion.

3. The apparatus according to claim 1, further comprising:
a restricting portion configured to restrict the hand from positionally shifting in the horizontal direction with respect to the main body of the hand when the hand is to be pivoted about the vertical axis of the reference position of the hand.

4. The apparatus according to claim 3, wherein the restriction portion includes
a protrusion formed on one of the hand and the main body, and
an engaging portion formed on the other of the hand and the main body and configured to engage with the protrusion.

5. The apparatus according to claim 1, wherein an engaging protrusion configured to engage with an engagement hole formed in a back surface of the substrate chuck is formed on the placement surface of each of the plurality of hand distal end portions.

6. The apparatus according to claim 5, wherein the reference position is set at a midpoint of a straight line connecting the respective engaging protrusions of the plurality of hand distal end portions.

7. The apparatus according to claim 1, wherein a scale configured to represent a pivotal amount of the hand is arranged on the hand.

8. The apparatus according to claim 1, wherein the plurality of hand distal end portions are two hand distal end portions each including a placement surface on which the substrate chuck is to be placed.

9. A substrate processing apparatus for processing a substrate, comprising:
a conveyance apparatus defined in claim 1;
a stage configured to support a substrate chuck conveyed by the conveyance apparatus; and
a detector configured to detect a mark formed on the substrate chuck which is supported by the stage,
wherein the conveyance apparatus adjusts, based on a detection result obtained by the detector, a position of the substrate chuck in a rotation direction about the center axis.

10. The apparatus according to claim 9, wherein the substrate processing apparatus is an apparatus configured to perform processing for forming a pattern on the substrate.

11. A method of manufacturing an article, comprising:
forming a pattern on a substrate by using a substrate processing apparatus defined in claim 10; and
processing the substrate on which the pattern has been performed, wherein the article is manufactured from the substrate that has undergone the processing.

12. A conveyance apparatus for conveying a substrate chuck, comprising:
a hand configured to support the substrate chuck;
a main body configured to pivotally support the hand about a vertical axis and move in a horizontal direction and a vertical direction; and
a guiding portion provided in the main body and configured to guide pivotal motion of the hand,
wherein the hand includes a plurality of hand distal end portions each including a placement surface on which the substrate chuck is to be placed, and a hand proximal end portion supported by the main body and configured to support a base portion of each of the plurality of hand distal end portions,
wherein an end surface of the hand proximal end portion facing the main body is formed in an arc shape of a circle centered about a vertical axis of a reference position between the plurality of the hand distal end portions,
wherein the guiding portion includes a guiding surface that has a shape corresponding to the end surface of the hand proximal end portion, and is configured to slidably contact the end surface,
wherein the apparatus further comprises a restricting portion configured to restrict the hand from positionally shifting in the horizontal direction with respect to the main body of the hand when the hand is to be pivoted about the vertical axis of the reference position of the hand, and
wherein the restriction portion includes:
a protrusion formed on one of the hand and the main body; and
an engaging portion formed on the other of the hand and the main body and configured to engage with the protrusion.

13. A conveyance apparatus for conveying a substrate chuck, comprising:
a hand configured to support the substrate chuck;
a main body configured to pivotally support the hand about a vertical axis and move in a horizontal direction and a vertical direction; and
a guiding portion provided in the main body and configured to guide pivotal motion of the hand,
wherein the hand includes a plurality of hand distal end portions each including a placement surface on which the substrate chuck is to be placed, and a hand proximal end portion supported by the main body and configured to support a base portion of each of the plurality of hand distal end portions,
wherein an end surface of the hand proximal end portion facing the main body is formed in an arc shape of a circle centered about a vertical axis of a reference position between the plurality of the hand distal end portions,
wherein the guiding portion includes a guiding surface that has a shape corresponding to the end surface of the hand proximal end portion, and is configured to slidably contact the end surface, and
wherein an engaging protrusion configured to engage with an engagement hole formed in a back surface of the substrate chuck is formed on the placement surface of each of the plurality of hand distal end portions.

14. A conveyance apparatus for conveying a substrate chuck, comprising:
a hand configured to support the substrate chuck;

a main body configured to pivotally support the hand about a vertical axis and move in a horizontal direction and a vertical direction; and a guiding portion provided in the main body and configured to guide pivotal motion of the hand, wherein the hand includes a plurality of hand distal end portions each including a placement surface on which the substrate chuck is to be placed, and a hand proximal end portion supported by the main body and configured to support a base portion of each of the plurality of hand distal end portions, wherein an end surface of the hand proximal end portion facing the main body is formed in an arc shape of a circle centered about a vertical axis of a reference position between the plurality of the hand distal end portions, wherein the guiding portion includes a guiding surface that has a shape corresponding to the end surface of the hand proximal end portion, and is configured to slidably contact the end surface, and wherein a scale configured to represent a pivotal amount of the hand is arranged on the hand.

15. A substrate processing apparatus for processing a substrate, comprising:

a conveyance apparatus defined in claim 12;

a stage configured to support a substrate chuck conveyed by the conveyance apparatus; and a detector configured to detect a mark formed on the substrate chuck which is supported by the stage, wherein the conveyance apparatus adjusts, based on a detection result obtained by the detector, a position of the substrate chuck in a rotation direction about a center axis.

16. The apparatus according to claim 15, wherein the substrate processing apparatus is an apparatus configured to perform processing for forming a pattern on the substrate.

17. A method of manufacturing an article, comprising:

forming a pattern on a substrate by using a substrate processing apparatus defined in claim 16; and processing the substrate on which the pattern has been performed, wherein the article is manufactured from the substrate that has undergone the processing.

18. A substrate processing apparatus for processing a substrate, comprising:

a conveyance apparatus defined in claim 13;

a stage configured to support a substrate chuck conveyed by the conveyance apparatus; and a detector configured to detect a mark formed on the substrate chuck which is supported by the stage, wherein the conveyance apparatus adjusts, based on a detection result obtained by the detector, a position of the substrate chuck in a rotation direction about a center axis.

19. The apparatus according to claim 18, wherein the substrate processing apparatus is an apparatus configured to perform processing for forming a pattern on the substrate.

20. A method of manufacturing an article, comprising:

forming a pattern on a substrate by using a substrate processing apparatus defined in claim 19; and processing the substrate on which the pattern has been performed, wherein the article is manufactured from the substrate that has undergone the processing.

21. A substrate processing apparatus for processing a substrate, comprising:

a conveyance apparatus defined in claim 14;

a stage configured to support a substrate chuck conveyed by the conveyance apparatus; and a detector configured to detect a mark formed on the substrate chuck which is supported by the stage, wherein the conveyance apparatus adjusts, based on a detection result obtained by the detector, a position of the substrate chuck in a rotation direction about a center axis.

22. The apparatus according to claim 21, wherein the substrate processing apparatus is an apparatus configured to perform processing for forming a pattern on the substrate.

23. A method of manufacturing an article, comprising:

forming a pattern on a substrate by using a substrate processing apparatus defined in claim 22; and processing the substrate on which the pattern has been performed, wherein the article is manufactured from the substrate that has undergone the processing.

* * * * *